(12) United States Patent
Chang et al.

(10) Patent No.: US 6,689,663 B1
(45) Date of Patent: Feb. 10, 2004

(54) METHODS OF CODE PROGRAMMING A MASK ROM

(75) Inventors: Ching-Yu Chang, Hsinchu (TW); Ta-Horng Yang, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/218,101

(22) Filed: Aug. 12, 2002

(51) Int. Cl.[7] .......................................... H01L 21/8246
(52) U.S. Cl. ...................................... 438/275; 438/276
(58) Field of Search ................................. 438/275–279

(56) References Cited

U.S. PATENT DOCUMENTS

| | | | |
|---|---|---|---|
| 6,417,548 B1 * | 7/2002 | Sheu et al. | 257/391 |
| 6,420,235 B1 * | 7/2002 | Wang | 438/275 |

* cited by examiner

Primary Examiner—Jey Tsai
(74) Attorney, Agent, or Firm—Stout, Uxa, Buyan & Mullins, LLP

(57) ABSTRACT

A method of code programming a mask read only memory (ROM) is disclosed. According to the method, a first photoresist layer is formed over word lines and a gate oxide layer of a substrate already having implanted bit lines. The first photoresist layer is patterned to develop pre-code openings over all of the memory cells, which correspond to intersecting word and bit lines. The first photoresist layer is then hardened using either a treatment implant or a treatment plasma. Subsequently, a second photoresist layer is formed over the first photoresist layer and patterned to develop real-code openings over memory cells which are actually to be coded with a logic "0" value. Each memory cell to be coded is then implanted with implants passing through the pre-code openings and the real code openings and into the memory cell.

24 Claims, 3 Drawing Sheets

METHODS OF CODE PROGRAMMING A MASK ROM

BACKGROUND OF THE INVENTION

1. Field of the Invention

The present invention relates to non-volatile memory devices and, more particularly, to methods of code programming read-only memory (ROM) semiconductor devices.

2. Description of Related Art

A non-volatile, semiconductor memory device is designed to securely hold data even when power is lost or removed from the memory device. The read-only memory (ROM) is a non-volatile memory device widely used in microprocessor-based digital electronic equipment for storing predetermined programs.

Arrays of memory cells are conventionally disposed in ROM devices for storing data, wherein each memory cell includes a transistor. These transistors, which typically comprise metal-oxide-semiconductor field effect transistors (MOSFETs), are disposed at intersecting bit lines and word lines of the memory device. Data bit values or codes held by these memory cell transistors are permanently stored in the physical or electrical properties of the individual memory cells. Generally speaking, a consequence of the non-volatile nature of a ROM is that data stored in the memory device can only be read.

The fixation of this "read-only" data into the ROM is performed during a code programming process at the original manufacture or fabrication of the memory device. Code programming a ROM typically entails ion implanting the read-only data into transistor channel regions of selected memory cells of the memory.

Since only the channel regions of only selected memory-cell transistors are ion implanted, other areas of the memory device should be covered and protected during the ion-bombardment step. Accordingly, code photomasks have been developed in the prior art for permitting the implantation of ions only into selected regions of the semiconductor. Usage of code photomasks during the code programming process has lead to the characterization of these memory devices as mask ROMs.

Regarding code photomasks, these tools for facilitating code programming of the mask ROM operate using principles of photolithography. Photolithography is a method of transferring a pattern onto a substrate so as to create structures down to the scale of fractions of a micron. A photolithography process can be incorporated, for example, in the fabrication of many modem devices such as MEMS (micro-electro-mechanical systems), optics, and semiconductor devices including mask ROMs.

A typical optical photolithographic process is implemented by depositing onto a substrate such as a semiconductor wafer, by some means (usually a spinner), a layer of photosensitive resist which can be patterned by exposure to ultraviolet (UV) light or another radiation type. To undergo exposure, the photoresist covered wafer is placed beneath a photomask designed to prevent the penetration of radiation through certain portions of the photoresist. Predetermined areas of the photoresist then undergo a degree of polymerization or depolymerization, which can be a function of the nature and extent of photoresist exposure to the radiation. A chemical bath known as a developer can then be used to dissolve parts of the photoresist which remain relatively depolymerized after the radiation by placing the wafer therein and allowing the wafer to be rinsed for a designated time period. Having received the pattern from the photomask, the layer of photoresist on the wafer is typically referred to as a layer of patterned photoresist.

A patterned photoresist layer can be created either on a bare wafer or on a number of previously generated layers of a wafer, with a limitation that the layer or layers should have somewhat planar surfaces to avoid problems including depth of focus variances. Common uses for patterned photoresist include selectively doping certain areas of a wafer while preventing other protected areas from being implanted, and selectively etching underlying layers on a substrate. When used as an implantation barrier, the patterned photoresist can prevent the underlying protected areas from receiving dopant, thereby allowing electrical properties of the substrate to differ between sites. When used as an etch barrier, the patterned photoresist can be functionally unaffected by the etching process, thereby protecting material under the patterned photoresist from being etched.

In certain process steps, it may be beneficial to utilize two consecutively stacked layers of photoresist, with each of the two photoresist layers having a distinct and separate pattern. According to such a construction, certain areas of the substrate can be covered by both photoresist layers, while other areas are covered only partially by a single photoresist layer or not covered at all. When utilizing double photoresist layers, however, a tendency can exist for the first photoresist layer to become softened (depolymerized) during exposure of or to the second photoresist layer. Other problems that may occur with the first photoresist layer include wrinkling due to an additional bake step in connection with processing of the second photoresist layer, loss of dimensional integrity, and the dissolving of portions of the first layer when the substrate is subjected to a developer for the second time. These shortcomings may have the undesirable effect of creating a larger process window and, consequently, may decrease the resolution of the photoresist.

As an alternative solution which may avoid the aforementioned difficulties, prior-art photolithography approaches typically utilize an oxide layer in combination with one or more photoresist layers. For example, an oxide layer can be positioned beneath a second photoresist layer, in place of the first photoresist layer. Implementation of the oxide layer can achieve desired etching and implanting goals in accordance with circuit fabrication objectives without many of the above-discussed problems. Known shortcomings are presented in connection with fabrication processes utilizing oxide layers instead of the first photoresist patterns, as well. For instance, further processing steps are required to pattern the oxide layers, which steps can lead to increased processing times, consumption of additional materials, and augmented costs. Undesirable particles can also be introduced during the oxide deposition and during the oxide patterning process. Furthermore, implementation of an oxide pre-code masking process may induce a critical dimension (CD) bias, and may cause etch uniformity related issues. Imprecise CD control during formation of a pre-code pattern in an oxide layer can adversely affect the real-code implantation process. In the context of mask ROM fabrication and coding, it is desirable to code program the memory devices as quickly and simply as possible, with a minimal expenditure of resources and a minimal risk of adverse particle introduction and CD bias.

A need thus exists in the prior-art for methods of manufacturing mask ROMs in which processing times and materials can be attenuated, to thereby reduce costs. A need also exists for reliable code programming methods which can decrease the potential for particle contamination during the pre-code steps. Furthermore, with device sizes approaching the resolution limit of optical photolithography, wherein, for example, a code implantation area may be 0.15 um$^2$, a need continues in the prior-art to exercise precise pre-code and real-code CD control to thereby maintain device performance in a cost effective manner.

SUMMARY OF THE INVENTION

The present invention addresses these needs by providing, in accordance with one aspect, non-volatile memory coding structures and methods for making the same which can be fast, clean, controlled, and simple in construction. The invention disclosed herein provides a method of code programming a mask ROM, wherein a negative photoresist is placed over word lines of the ROM and patterned to thereby form the ROM pre-code pattern directly in the negative photoresist. The negative photoresist is then hardened to enable the forming of a second layer of photoresist directly on the negative photoresist, wherein the second layer of photoresist is patterned to comprise ROM real-code openings for facilitating a subsequent code-programming implantation step. In accordance with another aspect of the invention, a positive photoresist is used instead of the negative photoresist.

To achieve these and other advantages and in accordance with a purpose of the invention, as embodied and broadly described herein, the invention provides a method of code programming a ROM device having implanted bit lines disposed beneath and intersecting with word lines, and having a gate oxide layer disposed between the bit lines and the word lines. The method comprises a step of forming a first photoresist layer, which can be a negative photoresist, over the word lines and the gate oxide layer. The first photoresist layer is patterned to develop pre-code openings over all of the memory cells which may be candidates for coding, and then hardened using either a treatment implant or a treatment plasma. Subsequently, a second photoresist layer is formed over the first photoresist layer and patterned to develop real-code openings over memory cells which are to be coded with for example a logic "0" value. Each memory cell to be coded is then implanted with particles passing through the pre-code and the real code openings and into the memory cells. The first photoresist layer can be a positive photoresist in other embodiments.

According to one aspect of the invention, a method of fabricating a semiconductor device structure is provided, comprising the steps of depositing an anti-reflective coating (ARC) on a substrate; placing a photoresist layer on the ARC, wherein the ARC is sandwiched between the substrate and the photoresist layer, a disposition of the photoresist layer over the ARC being such that no patterned layers sufficient to block a code implant of the semiconductor device are present between the photoresist layer and the ARC; forming a pattern into the photoresist layer; and treating the photoresist layer using at least one of an incident beam of implants and a plasma.

In one implementation of the present invention, the photoresist layer comprises a first photoresist layer, the pattern comprises a pre-code pattern, and the substrate comprises a polysilicon word line. The method can further comprise the steps of storing the semiconductor device in a storage location; retrieving the semiconductor device from the storage location; forming a second photoresist layer over the first photoresist layer; selectively exposing the second photoresist layer to define a real-code pattern therein; and implanting particles through openings in the real-code pattern and into the substrate. The treatment implants can comprise a 10 Kev to 50 Kev 1E15 to 5E15 dose Ar or $N_2$ implant. The first photoresist layer comprises openings corresponding to the pre-code pattern, and the second photoresist layer comprises openings corresponding to the real-code pattern. The pre-code openings are greater in number than the real-code openings; and a plurality of the real-code openings are aligned with a corresponding plurality of the pre-code openings. The treatment implants pass through the aligned real-code openings and into portions of the substrate to be code programmed. In accordance with one aspect, the semiconductor device comprises a mask ROM and the implanting step implants impurities into channels of selected memory cell transistors, so that those selected memory cell transistors have electrical properties corresponding to a logic "0" value.

In accordance with another aspect of the invention, the step of retrieving the semiconductor device can be performed after receipt of a customer order for a purchase of the semiconductor device; and the method can further comprise a step of removing the first and second layers of photoresist using a plasma ashing process such as $O_2$ plasma ashing.

According to still another aspect of the present invention, an intermediate-processing structure of a ROM device comprises a semiconductor substrate; a plurality of parallel implanted bit lines, the implanted bit lines being oriented in a first direction; a gate oxide layer above the semiconductor substrate; a plurality of word lines formed above the gate oxide layer, the word lines being oriented in a second direction; and a patterned photoresist layer over the word lines and the gate oxide layer, the patterned photoresist layer having ROM pre-code openings positioned between adjacent bit lines and further being treated using at least one of a treatment implant and a treatment plasma. A disposition of the patterned photoresist layer over the word lines is such that no patterned layers sufficient to block a code implant of the ROM are present between the patterned photoresist layer and the word lines. The patterned photoresist layer can comprise a negative photoresist material. In other embodiments, the patterned photoresist layer can comprise a positive photoresist material.

In one aspect of the invention, the patterned photoresist layer can comprise a first photoresist layer; and the intermediate-processing structure can further comprise a second photoresist layer disposed over the first photoresist layer and being patterned to comprise ROM real-code openings therein, and particles implanted into channel regions of the semiconductor substrate, wherein positions of the implanted particles correspond to aligned openings extending through both the pre-code openings and the real-code openings. An ARC can be disposed between the first photoresist layer and the word lines; and the particles can comprise implants which have been implanted through the real-code openings, through corresponding word lines and into the channel regions of the semiconductor substrate between adjacent bit lines. The word lines can comprise polysilicon; the first photoresist layer can be treated with treatment implants; the substrate can comprises a semiconductor substrate having a P type background impurity; the bit lines can be formed of N type impurity; and the implanted ions in the substrate between adjacent bit lines can comprise P type impurity.

Accordance to another aspect of the present invention, a semiconductor ROM structure comprises at least one word line; and a photoresist layer disposed over at the least one word line, the photoresist layer comprising a ROM pre-code pattern and being treated using at least one of an incident beam of implants and a plasma hardener, a disposition of the photoresist layer over the at least one word line being such that no patterned layers sufficient to block a code implant of the ROM are present between the photoresist layer and the at least one word line.

In accordance with yet another aspect of the present invention, a semiconductor device structure comprises a substrate; an anti-reflective coating (ARC) disposed on the substrate; a first photoresist layer disposed on the ARC, the first photoresist layer comprising a first pattern having first openings and being treated using at least one of an incident beam of implants and a plasma, wherein the ARC is sandwiched between the substrate and the first photoresist layer, a disposition of the first photoresist layer over the ARC being such that no patterned layers sufficient to block a code implant of the semiconductor device are present between the photoresist layer and the ARC; and a second photoresist layer disposed on the first photoresist layer and comprising a second pattern having second openings.

Any feature or combination of features described herein are included within the scope of the present invention provided that the features included in any such combination are not mutually inconsistent as will be apparent from the context, this specification, and the knowledge of one of ordinary skill in the art. Additional advantages and aspects of the present invention are apparent in the following detailed description and claims.

DETAILED DESCRIPTION OF THE PRESENTLY PREFERRED EMBODIMENTS

Figure 1:
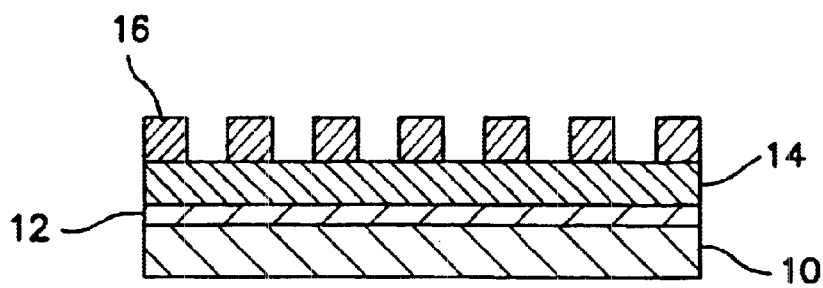
FIG. 1 is a cross-sectional view of a multilayer thin film stack corresponding to a processing methods of the prior art.

Reference will now be made in detail to the presently preferred embodiments of the invention, examples of which are illustrated in the accompanying drawings. Wherever possible, the same or similar reference numbers are used in the drawings and the description to refer to the same or like parts. It should be noted that the drawings are in greatly simplified form and are not to precise scale. In reference to the disclosure herein, for purposes of convenience and clarity only, directional terms, such as, top, bottom, left, right, up, down, above, below, beneath, rear, and front, are used with respect to the accompanying drawings. Such directional terms should not be construed to limit the scope of the invention in any manner.

Although.the disclosure herein refers to certain illustrated embodiments, it is to be understood that these embodiments are presented by way of example and not by way of limitation. The intent of the following detailed description is to cover all modifications, alternatives, and equivalents as may fall within the spirit and scope of the invention as defined by the appended claims. For example, it is understood by a person of ordinary skill in the art that the pre-code and real-code patterns formed by the methods of the present invention may be formed in NMOS, PMOS, CMOS and bipolar devices, to provide effective ion implantation in high density memory cells, such as memory cells with critical dimensions that are similar to physical limits of optical photolithography processes.

It is to be understood and appreciated that the process steps and structures described herein do not cover a complete process flow for the manufacture of memory devices. The present invention may be practiced in conjunction with various integrated circuit fabrication and coding techniques that are conventionally used in the art, and only so much of the commonly practiced process steps are included herein as are necessary to provide an understanding of the present invention.

Figure 2:
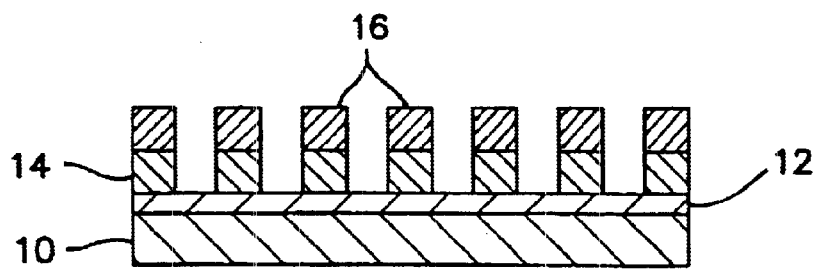
FIG. 2 is a cross-sectional view of the prior-art configuration of FIG. 1, in which an oxide layer has been etched.
Figure 3:
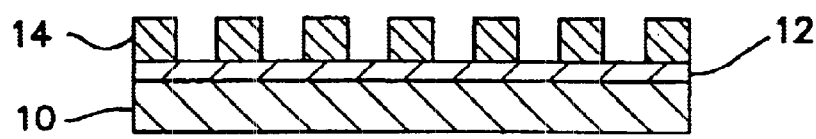
FIG. 3 is the cross-sectional prior-art view of FIG. 2, wherein a photoresist layer has been removed.
Figure 4:
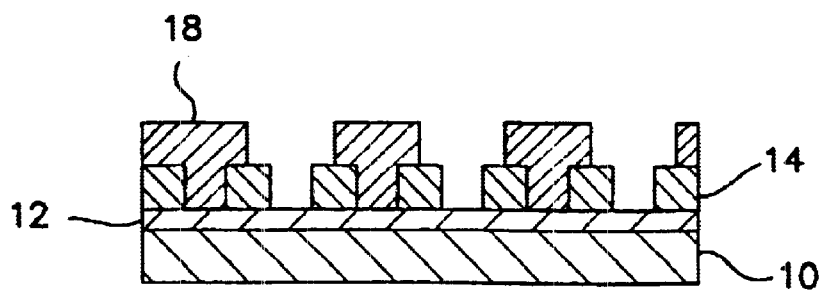
FIG. 4 is a cross-sectional view of the prior-art configuration of FIG. 3 with the addition of another photoresist layer.

Referring more particularly to the drawings, FIGS. 1–4 elucidate a prior-art photolithography process utilizing an oxide layer in combination with one or more photoresist layers. The cross-sectional view of FIG. 1 illustrates a multilayer thin film stack disposed over a substrate 10 which may comprise for example silicon or polysilicon. The stack comprises an anti-reflective coating in the form of silicon oxide nitride (SiON) 12, which is disposed beneath a silicon dioxide ($SiO_2$) layer 14. A first photoresist layer 16 has been spun onto the silicon dioxide layer 14 and patterned. FIG. 2 shows the thin film stack after an anisotropic dry etch has been performed on the silicon dioxide layer 14. A pattern comprising a relatively dense series of openings remains in the silicon dioxide layer 14. Removal of the first photoresist layer 16 is subsequently accomplished by exposure to a developer, after which only the patterned silicon dioxide layer 14 remains on the substrate as illustrated in FIG. 3. Turning to FIG. 4, a second photoresist layer 18 is then spun onto the patterned silicon dioxide layer 14. This second photoresist layer 18 is thereafter patterned using a conventional patterning process, which process can then be followed by the wafer being implanted by way of openings extending through both the patterned second photoresist layer 18 and the patterned silicon dioxide layer 14.

Now, the pattern obtained after patterning the second photoresist layer 18 can in some ways be similar to a pattern attainable using a double layer photoresist in accordance with the present invention. However, in the context of, for example, code programming a mask ROM, extra steps would be required when using the silicon dioxide layer 14 to define a pre-code pattern. Furthermore, such an application may not be as economical, contaminant-free or accurate.

Double photoresist layers in accordance with the present invention have been discovered to be particularly applicable in facilitating the fabrication and code programming of non-volatile semiconductor memory devices. A number of non-volatile semiconductor memory devices require code programming at the time of their manufacture. During the code programming of many of these memory devices, memory cells in the form of metal-oxide-semiconductor field effect transistors (MOSFETs) are ion implanted, wherein impurities are introduced into the MOSFETs to change their electrical characteristics. For instance, in the case of a non-volatile memory device in the form of a mask-programmable read-only-memory (ROM) device, code programming can be accomplished by introducing impurities into the channel regions of selected MOSFETS to thereby increase their threshold voltages.

Figure 5:
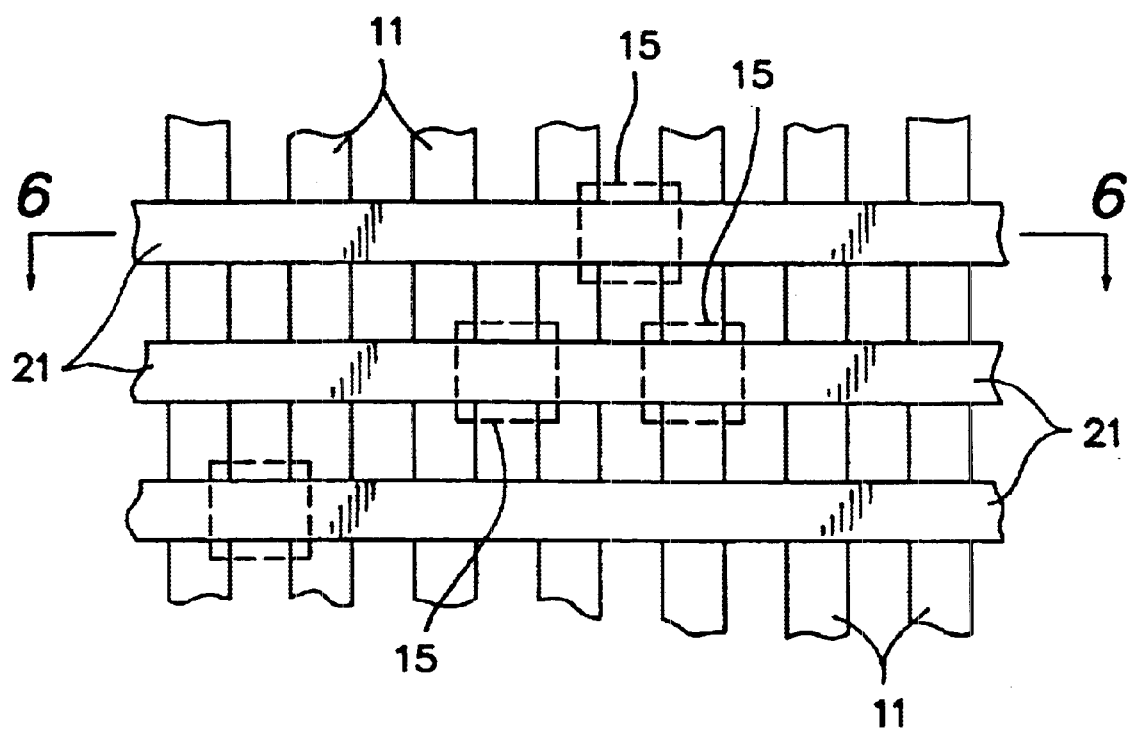
FIG. 5 is a schematic top view of a mask ROM array showing a plurality of orthogonally arranged bit lines and worldliness.

Turning to FIG. 5, a mask ROM array is shown disposed on a semiconductor substrate and having a plurality of orthogonally arranged bit lines 11 and word lines 21. The bit lines 11 are formed before the word lines 21 in the illustrated embodiment. In this embodiment, the substrate can comprises a background impurity type, and the bit lines 11 can be parallel formed therein by implantation of an impurity type opposite the background impurity type. For instance, the substrate can have a P-type background impurity type and the bit lines can be formed using N-type dopant, such as Arsenic or Phosphorous, ion implantation.

After formation of the bit lines 11, a gate oxide layer (not shown) is preferably formed on the substrate to a thickness of about 50 to about 300 Angstroms. The gate oxide can be grown using a thermal oxide process, which is preferentially performed in a chemical vapor deposition (CVD) furnace.

A conductive layer is then deposited by CVD, wherein the conductive layer has a grain size sufficient to exhibit desirable electrical properties. A photoresist is spun over the conductive layer and patterned by exposure to ultraviolet (UV) radiation. The pattern projected onto the photoresist is that of a plurality of parallel strips. An etch process is used to transfer the pattern into the conductive layer by etching back exposed portions of the polysilicon. The photoresist is subsequently removed to reveal a plurality of memory cell word lines 21, which are parallel to one another and orthogonal to the bit lines 11. These word lines 21, which preferably comprise a conductive material such as polysilicon, can be formed using low pressure chemical vapor deposition (LPCVD). As presently embodied, the bit lines 11 and the word lines 21 have widths of about 0.15 microns, and the word lines 11 are spaced apart by about 0.15 microns.

The bit lines 11 and word lines 21 in combination form MOSFET memory cells 15, which are exemplarily indicated by phantom rectangles in the figure. More particularly, a MOSFET memory cell 15 is defined at each intersection of a word line 21 and two bit lines 11. The bit lines 11 on the sides of each MOSFET memory cell 15 serve as source/drain regions, and the part of the word line 21 disposed between the source and drain regions serves as the gate of the MOSFET memory cell 15.

The MOSFET memory cells 15, which can be accessed via the corresponding bit lines 11 and word lines 21 to which they are connected, hold the data (or code) of the mask ROM. When a MOSFET memory cell 15 is accessed, a voltage applied at its gate by the word line 21 will either be higher or lower than a threshold voltage required for the gate to facilitate conduction between the source/drain bit lines 11. If the applied gate voltage is at or higher than the threshold voltage, the MOSFET memory cell 15 is turned on permitting a logic "1" value to be read; otherwise the MOSFET memory cell 15 is not turned on and a logic "0" value is read from the MOSFET memory cell 15.

When the channel of a given MOSFET memory cell 15 is ion implanted, its voltage threshold can be increased so that it will have a logic "0" value. The channel of a given MOSFET memory cell 15 to be implanted is located in the substrate under the word line 21 and between the adjacent bit lines 11. As distinguished from ion-implanted cells, non-implanted MOSFET memory cells 15 will have a logic "1" value and continue to conduct when potentials are applied to their gates via the word lines 21. The mask ROM can thus be programmed using ion implantation to change the logic values of selected MOSFET memory cells 15 from logic "1" values to logic "0" values.

Properly masking the channel regions of MOSFET memory cells 15 which are not to be implanted is a critical step in the code programming process. According to one aspect of the present invention, double layers of photoresist are used to shield from implanting (i.e., mask) the MOSFET memory cells 15 that are to hold a logic "1" value within the mask ROM. Regarding these double photoresist layers, they can be employed for photolithographic purposes as either positive photoresist, negative photoresist, or combinations thereof. Positive photoresist, also known as light-softening photoresist, can be depolymerized by exposure to radiation such as UV light. Therefore, with positive photoresist, areas exposed to radiation are dissolved upon placement in a developer, while the masked, unexposed areas remain unaffected. On the other hand, negative photoresist, which is a light-hardening photoresist, can be polymerized by exposure to radiation, meaning that the exposed areas remain, while the covered areas are dissolved. Thus, depending on the type of photoresist utilized, the pattern transferred to the photoresist on the wafer is either a positive or a negative image of the photomask pattern.

In accordance with an aspect of the present invention, negative photoresist can be used instead of positive photoresist in the context of sub-0.25 micron device dimensions. When dual layers of photoresist are constructed at these dimensions (e.g., 0.15 micron levels), negative photoresist may better maintain its profile through successive processing steps. Accordingly, in one embodiment the dual layer photoresist can be constructed with the bottom photoresist layer comprising negative photoresist. In another preferred embodiment, however, the bottom photoresist layer may comprise positive photoresist.

Figure 6:
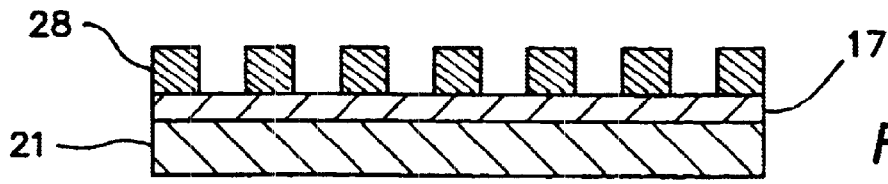
FIG. 6 is a partial cross-sectional view of a semiconductor device, such as a mask ROM, in an intermediate processing stage in accordance with the present invention.

A cross-sectional view of a mask ROM array, taken along the line 6—6 of FIG. 5, is provided in FIG. 6 wherein the sectional view is provided from the substrate on-up for simplicity. In other words, the sectional view of FIG. 6 does not show the gate oxide layer on the substrate and the implanted bit lines within the substrate. With particular reference to FIG. 6, a bottom anti-reflective coating (BARC) 17 is deposited on the word line 21. The BARC is highly absorbing, and preferably absorbs most of the radiation penetrating the photoresist, thereby reducing any reflective notching, standing wave effects and scattering of the radiation. In the presently preferred embodiment, the BARC comprises Brewer Science, Inc. DVU44 (product name), having a thickness from about 550 A to about 700 A, and more preferably having a thickness of about 600 A, and in other embodiments may comprise materials such as SiON. A spinner is next utilized to deposit a first photoresist layer 28, which in one embodiment is selected from the negative photoresist category, over the BARC 17. In another embodiment, the first photoresist layer 28 comprises a positive photoresist, comprising, for example, Acetal, annealing and hybrid type, SEPR203 (product name) by Ahin-Etsu resist company, at a thickness of about 3000 A to about 7000 A. In other embodiments, the negative photoresist may comprise TDUR-N620 GP (product name) by TOK company.

A pre-code pattern is then projected by a stepper or mask aligner onto the wafer, according to the photomask used. In accordance with an embodiment wherein negative photoresist is used for small-scale devices, wherever the first photoresist layer 28 is exposed to radiation such as UV light, the polymerization of the photoresist is enhanced. When positive photoresist is used, polymerization of the photoresist is greater in unexposed areas. A developer is subsequently used to dissolve the photoresist of less polymerization which was not exposed. The pre-code pattern defined by the photomask, corresponding to a dense series of exposed and unexposed areas, is therefore transferred onto the first layer of photoresist 28. As presently embodied, the pre-code pattern describes all of the possible MOSFET memory cell 15 windows which will be available for coding in a subsequent real-code programming step.

Following the pre-code patterning of the first photoresist layer 28, the first photoresist is treated with at least one of a treatment implant and a treatment plasma from a plasma etcher. As presently preferred, an implanter is used to bombard the wafer with treatment implants, which comprise dopants such as Ar and $N_2$. In a particular example, the first photoresist layer 28 can be treated with a 10 Kev to 50 Kev 1E15 to 5E15, and more preferably 15 to 3E15, dose Ar or $N_2$ implant. By reacting to the dopants, the first photoresist layer 28 apparently undergoes a significant change to its polymer structure, thereby hardening the first photoresist layer 28 and rendering it substantially more resilient to and, preferably, nearly impervious to subsequent photolithographic processing. Other treatment procedures may be used as an alternative to, or in addition to, the $Ar/N_2$ implantation treatments described herein, so long as the first photoresist layer is rendered substantially resilient to and, preferably, functionally impervious to subsequent photolithographic processing. Through experimentation, the formation of a diamond structure has been observed on the surface of the implanted photoresist using a Raman Spectra Analysis.

Figure 7:
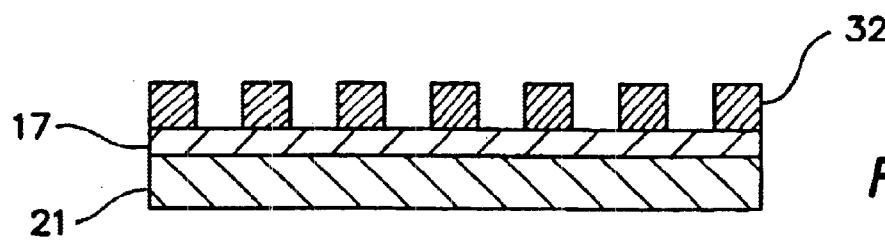
FIG. 7 is a cross-sectional view of the FIG. 6 configuration, in which the photoresist layer has been hardened according to the present invention.

The cross-sectional view of FIG. 7 is substantially similar to that of FIG. 6, with the difference being that the first photoresist layer has undergone treatment (e.g., implantation), thereby changing its structural composition and forming a hardened first photoresist layer 32. After the implantation, the hardened first photoresist layer 32 no longer remains as susceptible to exposure by UV radiation, does not readily dissolve in solvents, and tends to develop a limited resistance to thermal processing. It should be noted that the presently preferred implant used to harden the photoresist does not materially alter the electrical properties of the exposed regions of the wafer.

Figure 8:
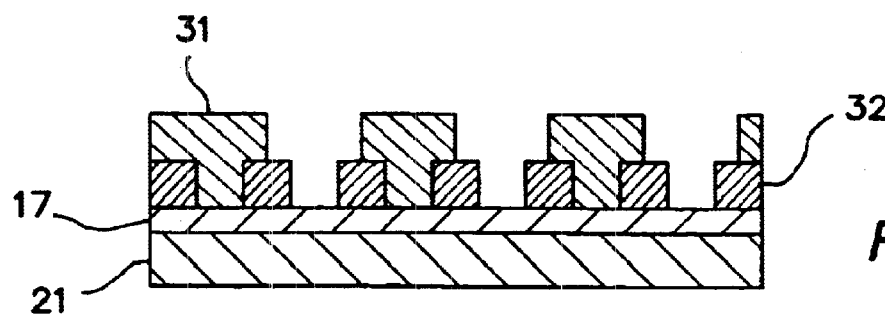
FIG. 8 is the cross-sectional view of the configuration of FIG. 7, with the addition of a second photoresist layer according to the present invention.

A second layer of photoresist 31 is thereafter spun directly over the hardened first photoresist layer 32. This second photoresist layer 31 can be selected from the negative or positive photoresist categories. In the case of a positive photoresist (e.g., SEPR203 by Ahin-Etsu resist company), the real-code photomask that must be selected is then a positive image of the final desired pattern. After selection and application of the real-code photomask the second layer of photoresist 31 is then patterned using conventional means, and depolymerized photoresist is dissolved by placement of the wafer into a chemical bath of developer. The hardened first photoresist layer 32, having been cured by ion implantation in such a way to make it substantially impervious to solvents and UV radiation, retains its structural integrity during development of the second photoresist layer 31. FIG. 8 shows a cross-sectional view of the second photoresist layer 31 directly over the hardened first photoresist layer 32. In combination with the hardened first photoresist layer 32, the second photoresist layer 31 determines which MOSFET memory cells 15 will have a logic "1" value and which memory cells will have a logic "0" value. In the illustrated embodiment, the channel regions of MOSFET memory cells 15 which are to be programmed with a "0" receive an implant, while the MOSFET memory cells 15 which are to be programmed with a "1" receive no implant so that their threshold voltages remain unchanged.

Figure 9:
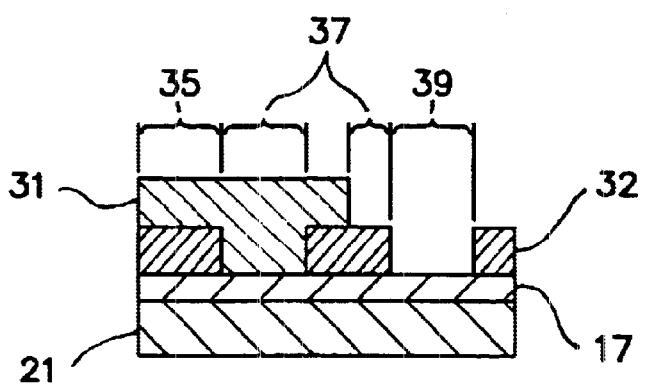
FIG. 9 is an expanded view of a portion of FIG. 8 in accordance with the present invention.

FIG. 9 shows an expanded view of a portion of FIG. 8, in which there exists a hardened first layer of photoresist 32 and a second layer of photoresist 31. The hardened first photoresist layer 32 has a pattern, and the second photoresist layer 31 has a pattern, the two patterns being separate and unique from one another. Regions 37 on the wafer may exist which are covered by only the hardened fist photoresist layer 32 or only the second photoresist layer 31, while other regions 35 are covered by both the hardened first photoresist layer 32 and the second photoresist layer 31. Further still, the regions 39, which correspond to both the pre-code openings of the first photoresist layer 32 and the real-code openings of the second photoresist layer 31, remain exposed for future processing. These regions 39 correspond to and allow for the implantation of dopants to the underlying channel regions of the MOSFET memory cells 15 that are to be programmed with a logic "0" value.

Areas left exposed by the pre-code and real-code photoresist layers 32 and 31, respectively, are thus implanted. In the illustrated embodiment wherein the bit lines are N-type regions, a P-type boron ion can be used for the code implants. The boron ions are implanted at energies sufficient to facilitate penetration thereof through the BARC layer 17, the word line 21 and the gate oxide layer, and into the selected channel regions of the substrate. After the wafer has been code implanted, both layers of photoresist can be removed. Even though the first photoresist layer possesses a new, more structurally sound, diamond structure, it can still be readily removed by conventional $O_2$ ashing. In the illustrated embodiment, no additional steps are required to remove the two photoresist layers than are normally used to remove a single layer of resist.

A preferred embodiment has been described wherein a first layer of photoresist is patterned over word lines of a non-volatile memory device. The photoresist pattern conforms to a pre-code resist pattern for the creation of mask-programmable ROMs. The pre-code pattern exposes all of the channels of cell regions on the wafer that might be coded (implanted). The wafer is then implanted with $N_2$ at an energy of about 50 Kev and a dose of about 1e^15 to harden the photoresist. In accordance with one aspect of the invention, the wafer comprising the hardened first layer of photoresist may then be stored for future coding.

In accordance with another aspect of the present invention, the first layer of photoresist is constructed to have a thickness and composition sufficient to protect underlying substrate features (e.g., bit lines and/or adjacent channels), which are not to be implanted, from harmful implantation during the subsequent code programming process. For example, inadvertent code implantation into a bit line can increase the resistance of the bit line due to the opposite impurity types. Accordingly, no patterned layers, having dimensions sufficient to block the subsequent code implant of the ROM or semiconductor device, need be present between the first photoresist layer and the word line. Similarly, no patterned layers sufficient to block the subsequent code implant of the ROM or semiconductor device need be present between the first photoresist layer and the ARC layer.

Subsequently, the wafer may be retrieved from storage. A second photoresist layer can then be spun on. The real-code pattern of the second photoresist layer can be determined by a customer's order, the pattern of the second photoresist layer being necessarily different from the first layer pattern. Thus, while the first photoresist layer exposes all of the areas that are possible to code, the second photoresist layer exposes only those layers that are to be coded with a value of "0" for the particular device being created. The exposed areas are then implanted, and both layers of photoresist are removed by for example first performing a dry strip and then a wet strip.

As an alternative embodiment, the first photoresist layer may be hardened by undergoing a plasma etch process after development, with the end result being a hardened photoresist layer that may be similar to that obtained by implanting the photoresist. The structural integrity of a photoresist hardened by a plasma etch may be substantially similar or comparable to the structural integrity of photoresist hardened by ion implantation. The steps preceding and following the plasma etch hardening process are in substantial correspondence with the steps before and after the ion implantation hardening process.

In view of the foregoing, it will be understood by those skilled in the art that the methods of the present invention can facilitate formation and code programming of read only memory devices in an integrated circuit. The above-described embodiments have been provided by way of example, and the present invention is not limited to these examples. Multiple variations and modification to the disclosed embodiments will occur, to the extent not mutually exclusive, to those skilled in the art upon consideration of the foregoing description. Such variations and modifications, however, fall well within the scope of the present invention as set forth in the following claims.

What is claimed is:

1. A method of code programming a ROM device having bit lines oriented in a first direction within a substrate, a gate oxide layer above the substrate, and word lines formed above the gate oxide layer in a second direction, the method comprising the following steps:
    forming a first photoresist layer over the word lines and the gate oxide layer;
    selectively exposing the first photoresist layer to develop first code openings, each first code opening being positioned over a word line and between two adjacent bit lines intersecting the word line;
    treating the first photoresist layer using at least one of a treatment implant and a treatment plasma;
    forming a second photoresist layer over the first photoresist layer;
    selectively exposing the second photoresist layer to develop second code openings therein; and
    implanting particles through the second code openings.

2. The method as set forth in claim 1, wherein the first photoresist layer comprises a negative photoresist material.

3. The method as set forth in claim 1, wherein:
    the first code openings are greater in number than the second code openings;
    a plurality of the second code openings are aligned with a corresponding plurality of the first code openings; and
    the substrate is treated with implanted impurities which pass through the aligned second code openings, through corresponding word lines and into portions of the substrate disposed between adjacent bit lines.

4. The method as set forth in claim 3, wherein:
    an anti-reflective coating (ARC) is disposed between the first photoresist layer and the word lines;
    the bit lines comprise parallel rows implanted within the substrate;
    the word line s comprise parallel, polysilicon lines that are orthogonally disposed with respect to the bit lines; and
    the step of treating the first photoresist layer comprises a step of hardening the first photoresist layer with a treatment implant.

5. The method as set forth in claim 4, where in the first photoresist layer comprises a negative photoresist material.

6. The method as set forth in claim 5, wherein:
    the treatment implant comprises a 10 Kev to 50 Kev 1E15 to 5E15 dose Ar or $N_2$ implant;
    the method further comprises a step of removing the first and second photoresist layers using an $O_2$ plasma ashing process;
    the substrate comprises a semiconductor substrate having a P type background impurity;
    the bit lines are formed of N type impurity; and
    the implanted impurities in the substrate between adjacent bit lines are P type impurity.

7. The method of claim 1, wherein the first photoresist layer comprises a positive photoresist material.

8. A method of fabricating a ROM structure having intersecting word lines and bit lines, comprising the following steps:
    forming a photoresist layer over a plurality of the word lines;
    generating openings in the photoresist layer, each opening being generated over a word line and between two adjacent bit lines which intersect the word line, to thereby define a ROM first code pattern, a disposition of the photoresist layer over the word lines being such that no patterned layers sufficient to block a code implant of the ROM are present between the photoresist layer and the word lines; and
    treating the photoresist layer using at least one of a treatment implant bombardment and a treatment plasma hardening.

9. The method as set forth in claim 8, wherein the photoresist layer comprises a negative photoresist material.

10. The method as set forth in claim 8, wherein the photoresist layer comprises a first photoresist layer, and the method further comprises the steps of:
    storing the ROM structure;
    retrieving the ROM structure for additional processing;
    forming a second photoresist layer over the first photoresist layer;
    selectively exposing the second photoresist layer to define a ROM real-code pattern therein; and
    implanting particles through openings in the real-code pattern to thereby code program the ROM structure.

11. The method as set forth in claim 10, wherein the step of retrieving the ROM structure is performed after a step of receiving a customer order for a ROM.

12. The method as set forth in claim 10, wherein:
    the word lines comprise polysilicon;
    the first photoresist layer comprises a positive photoresist material, which is bombarded with treatment-implants in the treating step; and
    the step of retrieving the ROM structure is performed after a step of receiving a customer order for a real-code ROM.

13. The method as set forth in claim 10, wherein:

the word lines comprise polysilicon;

the first photoresist layer comprises a positive photoresist material, which is bombarded with treatment-implants in the treating step;

the step of retrieving the ROM structure is performed after a step of receiving a customer order for a real-code ROM;

an ARC is disposed between the first photoresist layer and the word lines;

the treatment implants comprise a 10 Kev to 50 Kev 1E15 to 5E15 dose Ar or $N_2$ implant; and the method further comprises a step of removing the first and second layers of photoresist using an $O_2$ plasma ashing process.

14. A method of fabricating a semiconductor device structure, comprising the steps of:

depositing an anti-reflective coating (ARC) on a substrate;

placing a photoresist layer on the ARC, wherein the ARC is sandwiched between the substrate and the photoresist layer;

forming a pattern into the photoresist layer, a disposition of the photoresist layer over the ARC being such that no patterned layers sufficient to block a code implant of the semiconductor device are present between the photoresist layer and the ARC; and treating the photoresist layer using at least one of an incident beam of implants and a plasma.

15. The method as set forth in claim 14, wherein the photoresist layer comprises a negative photoresist material.

16. The method as set forth in claim 14, wherein the photoresist layer comprises a first photoresist layer and the pattern comprises a first code pattern, and wherein the method further comprises the following steps:

storing the semiconductor device in a storage location;

retrieving the semiconductor device from the storage location;

forming a second photoresist layer over the first photoresist layer;

selectively exposing the second photoresist layer to define a second code pattern therein; and implanting particles through openings in the second code pattern and into the substrate.

17. The method as set forth in claim 16, wherein:

the first photoresist layer is bombarded with treatment-implants in the treating step;

the step of retrieving the semiconductor device is performed after a step of receiving a customer order for the semiconductor device; and the method further comprises a step of removing the first and second layers of photoresist using a plasma ashing process.

18. The method as set forth in claim 16, wherein:

the substrate comprises polysilicon;

the first photoresist layer comprises a negative photoresist material;

the step of retrieving the semiconductor device is performed after a step of receiving a customer order for the semiconductor device;

the method further comprises a step of removing the first and second layers of photoresist using a plasma ashing process; and the treatment implants comprise a 10 Kev to 50 Kev 1E15 to 5E15 dose Ar or $N_2$ implant.

19. The method as set forth in claim 14, wherein the first photoresist layer comprises a positive photoresist material.

20. A method of fabricating a semiconductor ROM structure, comprising:

forming a word line on a substrate;

patterning a first photoresist layer over the word line, the first photoresist layer being patterned to have openings corresponding to a ROM pre-code pattern,; and treating the first photoresist layer using at least one of a treatment implant and a treatment plasma;

forming on the first photoresist layer a second photoresist layer, which comprises openings embodying a ROM real-code pattern; and implanting particles through the openings to thereby code program the ROM structure.

21. The method as set forth in claim 20, wherein a disposition of the photoresist layer over the word line is such that no patterned layers sufficient to block a code implant of the ROM are present between the first photoresist layer and the word line.

22. The method as set forth in claim 21, wherein the word line comprises polysilicon and an ARC is disposed between the polysilicon and the first photoresist layer.

23. The method as set forth in claim 21, wherein the first photoresist layer comprises a negative photoresist.

24. The method as set forth in claim 21, wherein the first photoresist layer comprises a positive photoresist.

* * * * *